(12) United States Patent
Lee et al.

(10) Patent No.: US 12,317,418 B2
(45) Date of Patent: May 27, 2025

(54) CONNECTING ASSEMBLY COMPRISING FLEXIBLE PRINTED CIRCUIT BOARD AND ELECTRONIC DEVICE INCLUDING THE SAME

(71) Applicant: SAMSUNG ELECTRONICS CO., LTD., Suwon-si (KR)

(72) Inventors: Wonho Lee, Suwon-si (KR);
Hyunggwang Kang, Suwon-si (KR);
Junhyuk Kim, Suwon-si (KR);
Hyunsuk Kim, Suwon-si (KR);
Sanghyuk Park, Suwon-si (KR);
Joongyeon Cho, Suwon-si (KR);
Nakhyun Choi, Suwon-si (KR);
Myunghoon Kwak, Suwon-si (KR);
Yangwook Kim, Suwon-si (KR);
Soyoung Lee, Suwon-si (KR);
Jookwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 18/091,973

(22) Filed: Dec. 30, 2022

(65) Prior Publication Data
US 2023/0171893 A1      Jun. 1, 2023

Related U.S. Application Data

(63) Continuation of application No. PCT/KR2022/013014, filed on Aug. 31, 2022.

(30) Foreign Application Priority Data

Nov. 29, 2021  (KR) .......................... 10-2021-0166568
Feb. 11, 2022  (KR) .......................... 10-2022-0018000

(51) Int. Cl.
H05K 1/02   (2006.01)
G06F 1/16   (2006.01)
H05K 1/14   (2006.01)

(52) U.S. Cl.
CPC ............. H05K 1/147 (2013.01); H05K 1/028 (2013.01); H05K 2201/056 (2013.01); H05K 2201/2027 (2013.01)

(58) Field of Classification Search
CPC .......... H05K 1/02; H05K 1/028; H05K 1/147; H05K 2201/056; H05K 2201/2027;
(Continued)

(56) References Cited

U.S. PATENT DOCUMENTS 5,717,969 A * 2/1998 Miyamoto ............... G02B 7/08
396/542
8,346,323 B2  1/2013 Morita
(Continued)

FOREIGN PATENT DOCUMENTS

CN       207166860        3/2018
EP       2244444          10/2010
(Continued)

OTHER PUBLICATIONS

International Search Report for PCT/KR2022/013014 dated Dec. 5, 2022, 3 pages.
(Continued)

*Primary Examiner* — Xiaoliang Chen
(74) *Attorney, Agent, or Firm* — Nixon & Vanderhye P.C.

(57) ABSTRACT

An electronic device is disclosed. The electronic device includes: a flexible printed circuit board configured to connect a first printed circuit board and a second printed circuit board and including a rigid area and a flexible area, and a guide at least partially coupled to the rigid area, and located inside the flexible printed circuit board.

13 Claims, 16 Drawing Sheets

(58) Field of Classification Search
CPC .. G02F 1/13452; G06F 1/1616; G06F 1/1656; G06F 1/1681; G06F 1/1683; G06F 1/1694; G06F 3/015; H04M 1/0216
USPC ............................. 361/749; 439/495; 349/58
See application file for complete search history.

(56) References Cited

U.S. PATENT DOCUMENTS

| | | |
|---|---|---|
| 8,644,026 B2 | 2/2014 | Park |
| 10,152,082 B2 * | 12/2018 | Bailey ................... G06F 1/1656 |
| 2007/0184709 A1 * | 8/2007 | Dombrowski ........ G06F 1/1616 |
| | | 439/495 |
| 2008/0303972 A1 * | 12/2008 | Han ................... G02F 1/13452 |
| | | 349/58 |
| 2009/0029741 A1 | 1/2009 | Satou et al. |
| 2010/0144409 A1 | 6/2010 | Huang et al. |
| 2016/0276757 A1 | 9/2016 | Smith et al. |
| 2021/0263558 A1 | 8/2021 | Bie et al. |

FOREIGN PATENT DOCUMENTS

| | | |
|---|---|---|
| JP | 2011-211403 | 10/2011 |
| KR | 10-1162948 | 7/2012 |
| KR | 10-2019-0087216 | 7/2019 |
| KR | 10-2020-0127617 | 11/2020 |

OTHER PUBLICATIONS

Extended European Search Report dated Jul. 9, 2024 issued in European Patent Application No. 22898774.9.

* cited by examiner

CONNECTING ASSEMBLY COMPRISING FLEXIBLE PRINTED CIRCUIT BOARD AND ELECTRONIC DEVICE INCLUDING THE SAME

CROSS-REFERENCE TO RELATED APPLICATIONS

This application is a continuation of International Application No. PCT/KR2022/013014 designating the United States, filed on Aug. 31, 2022, in the Korean Intellectual Property Receiving Office and claiming priority to Korean Patent Application No. 10-2021-0166568, filed on Nov. 29, 2021, in the Korean Intellectual Property Office, and to Korean Patent Application No. 10-2022-0018000 filed on Feb. 11, 2022, in the Korean Intellectual Property Office, the disclosures of all of which are incorporated by reference herein in their entireties.

BACKGROUND

1. Field

The disclosure relates to a connecting assembly comprising a flexible printed circuit board and an electronic device including the same.

2. Description of Related Art

Electronic devices including flexible displays are being developed. For example, one housing may move relative to another housing such that a screen display area of a display may be expanded or reduced.

SUMMARY

According to an example embodiment, an electronic device may include: a first housing comprising a first printed circuit board (PCB), a second housing comprising a second PCB and configured to move in a first direction and a second direction opposite to the first direction with respect to the first housing, a flexible printed circuit board (FPCB) comprising a first part connected to the first PCB, a second part connected to the second PCB, and a third part between the first part and the second part, wherein the third part comprises a rigid area and a flexible area, and a guide at least partially coupled to the rigid area, and located inside the FPCB, wherein the FPCB is configured to change shape between a folded form in which the FPCB is folded inward and an unfolded form in which the FPCB is unfolded outward.

According to an example embodiment, a connecting assembly comprises a flexible printed circuit board (FPCB) comprising: a first part, a second part, and a third part between the first part and the second part, wherein the third part comprises a rigid area and a flexible area, and a guide at least partially coupled to the rigid area, and located inside the FPCB, wherein the FPCB is configured to change shape between a folded form in which the FPCB is folded inward and an unfolded form in which the FPCB is unfolded outward.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
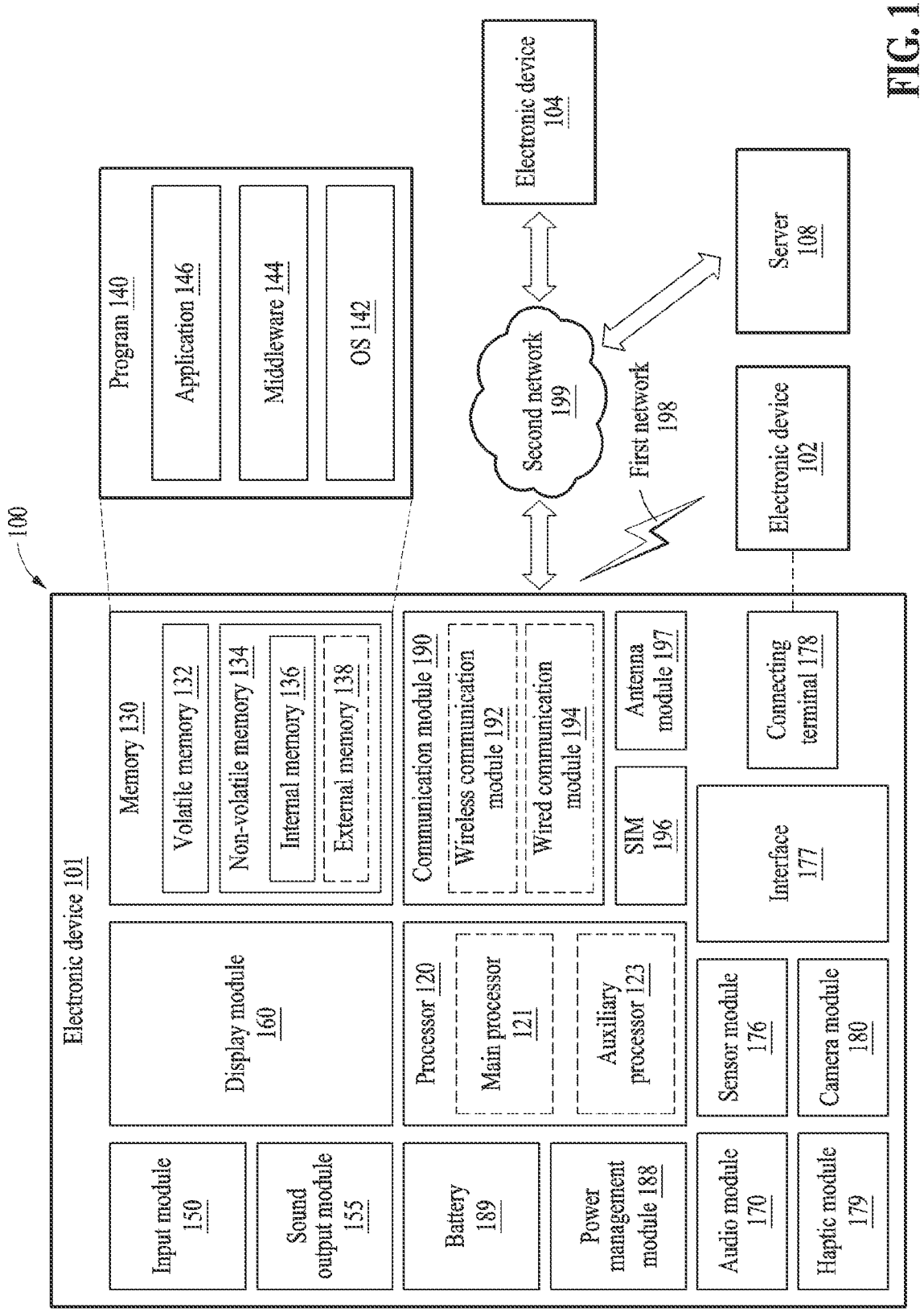
FIG. 1 is a block diagram illustrating an example electronic device in a network environment according to an example embodiment.

FIG. 1 is a block diagram illustrating an example electronic device in a network environment according to an example embodiment.

FIG. 1 is a block diagram illustrating an electronic device 101 in a network environment 100 according to an example embodiment. Referring to FIG. 1, the electronic device 101 in the network environment 100 may communicate with an electronic device 102 via a first network 198 (e.g., a short-range wireless communication network), or communicate with at least one of an electronic device 104 and a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a motor 187, a power management module 188, a battery 189, a communication module 190, a subscriber identification module (SIM) 196, or an antenna module 197. In an example embodiment, at least one of the components (e.g., the connecting terminal 178) may be omitted from the electronic device 101, or one or more other components may be added to the electronic device 101. In an example embodiment, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computations. According to an example embodiment, as at least a part of data processing or computations, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specifically for artificial intelligence model processing. An artificial intelligence model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence (AI) model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control its corresponding one of the display, the hologram device, and the projector. According to an example embodiment, the display module 160 may include a touch sensor adapted to detect a touch, or a pressure sensor adapted to measure the intensity of force of the touch.

The audio module 170 may convert sound into an electric signal or vice versa. According to an example embodiment, the audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with the external electronic device (e.g., the electronic device 102) directly (e.g., by wire) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). According to an example embodiment, the connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, and flashes The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to an example embodiment, the antenna module 197 may form a mmWave antenna module. According to an example embodiment, the mmWave antenna module may include a PCB, an RFIC on a first surface (e.g., the bottom surface) of the PCB, or adjacent to the first surface of the PCB and capable of supporting a designated high-frequency band (e.g., a mmWave band), and a plurality of antennas (e.g., array antennas) disposed on a second surface (e.g., the top or a side surface) of the PCB, or adjacent to the second surface of the PCB and capable of transmitting or receiving signals of the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. According to an example embodiment, all or some of operations to be executed by the electronic device 101 may be executed by one or more external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or the service, may request the one or more external electronic devices to perform at least part of the function or service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or MEC. In an example embodiment, the external electronic device (e.g., the electronic device 104) may include an Internet-of-things (IoT) device. The server 108 may be an intelligent server using machine learning and/or a neural network. According to an example embodiment, the external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

The electronic device according to an example embodiment may be one of various types of electronic devices. The electronic device may include, for example, a portable communication device (e.g., a smartphone), a computer device, a portable multimedia device, a portable medical device, a camera, a wearable device, a home appliance device, or the like. According to an example embodiment of the disclosure, the electronic device is not limited to those described above.

It should be understood that an example embodiment of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., by wire), wirelessly, or via a third element.

As used in connection with an example embodiment of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

According to an example embodiment, each component (e.g., a module or a program) of the above-described components may include a single entity or multiple entities, and some of the multiple entities may be separately disposed in different components. According to an example embodiment, one or more of the above-described components may be omitted, or one or more other components may be added. Alternatively or additionally, a plurality of components (e.g., modules or programs) may be integrated into a single component. In such a case, according to an example embodiment, the integrated component may still perform one or more functions of each of the plurality of components in the same or similar manner as they are performed by a corresponding one of the plurality of components before the integration. According to an example embodiment, operations performed by the module, the program, or another component may be carried out sequentially, in parallel, repeatedly, or heuristically, or one or more of the operations may be executed in a different order or omitted, or one or more other operations may be added.

Figure 2A:
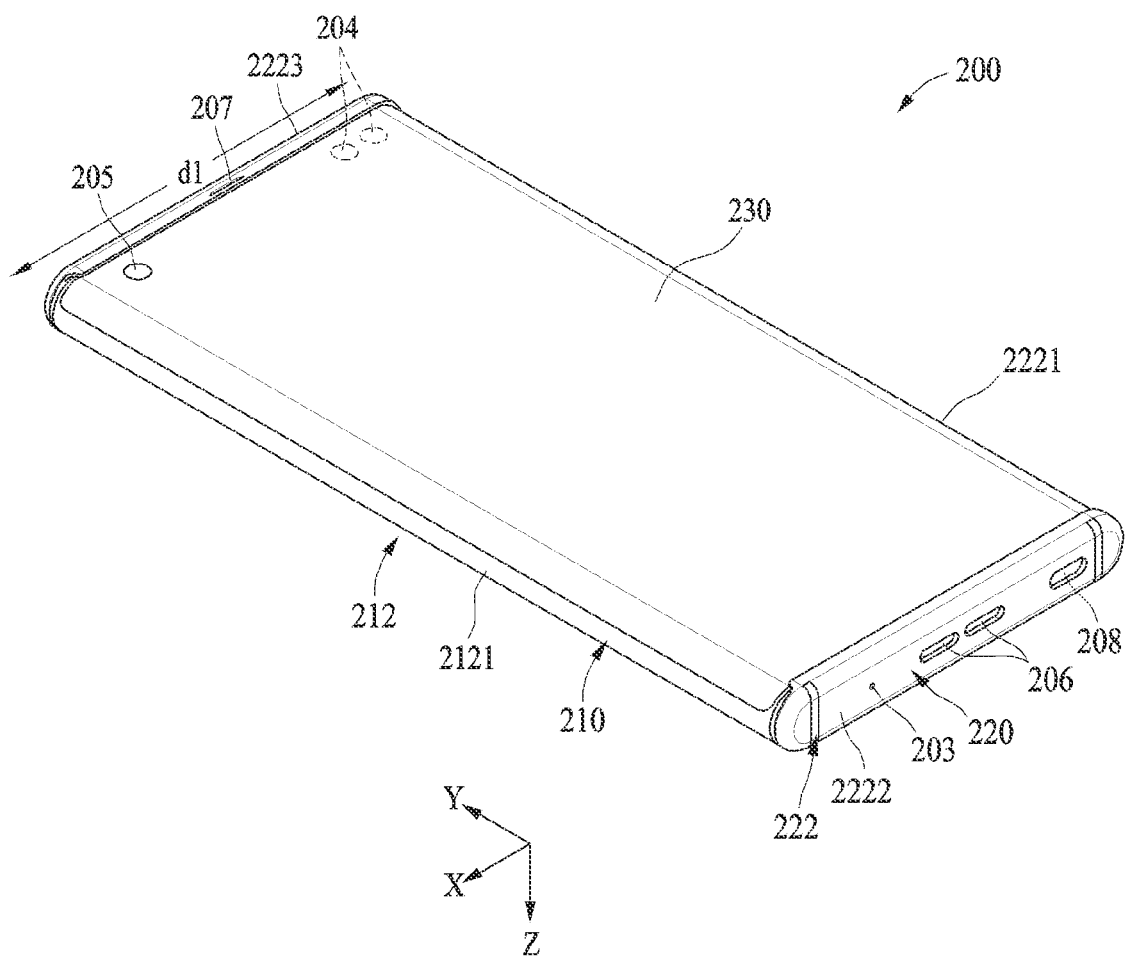
FIG. 2A is a front perspective view illustrating a closed state of an example electronic device according to an example embodiment.
Figure 2B:
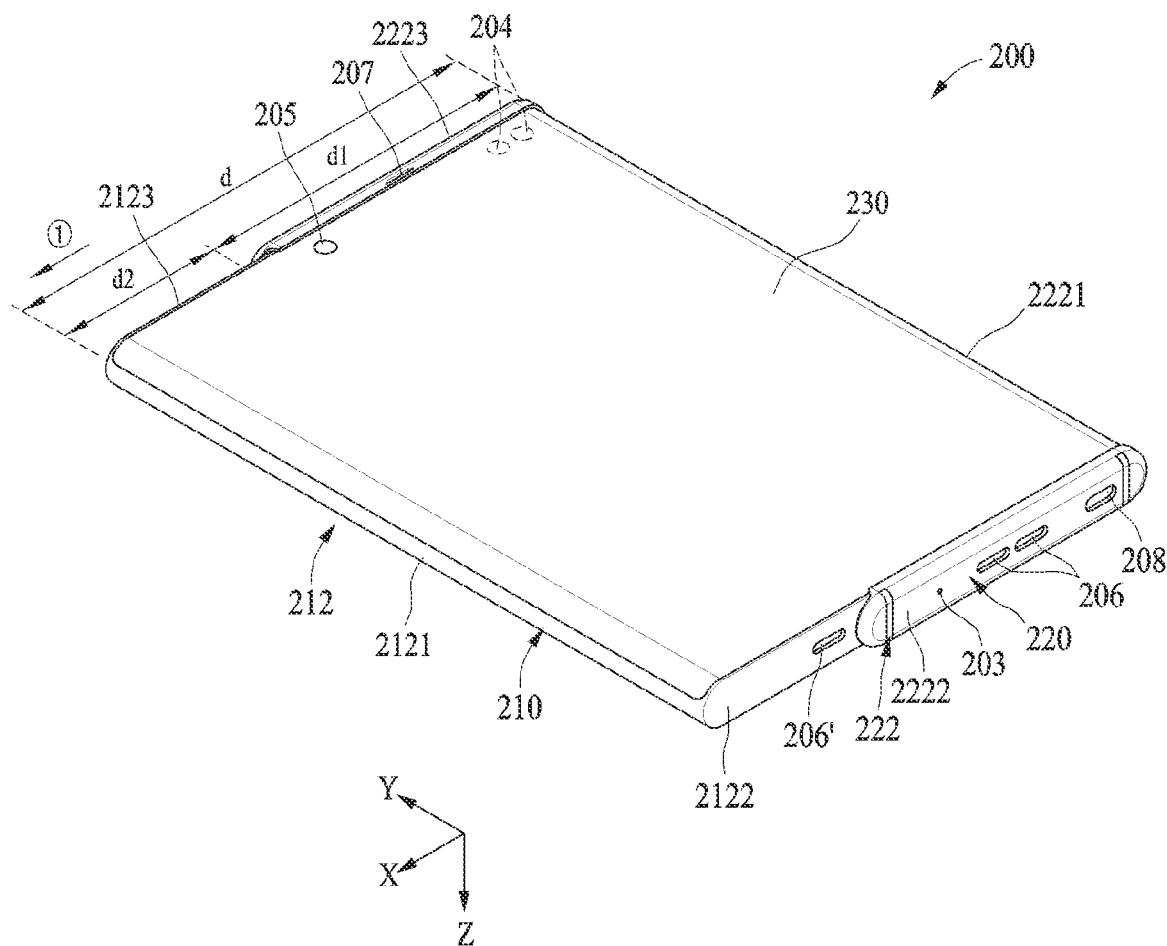
FIG. 2B is a front perspective view illustrating an open state of the electronic device according to an example embodiment.
Figure 2C:
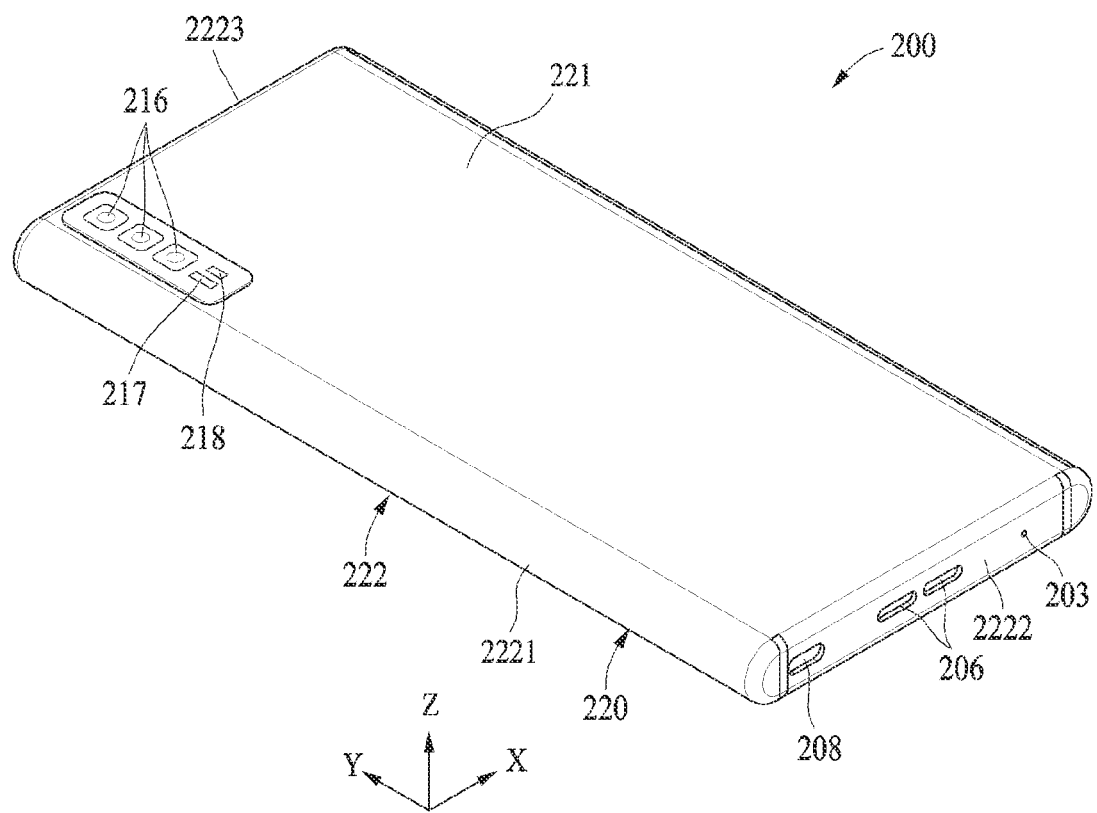
FIG. 2C is a rear perspective view illustrating the closed state of the electronic device according to an example embodiment.
Figure 2D:
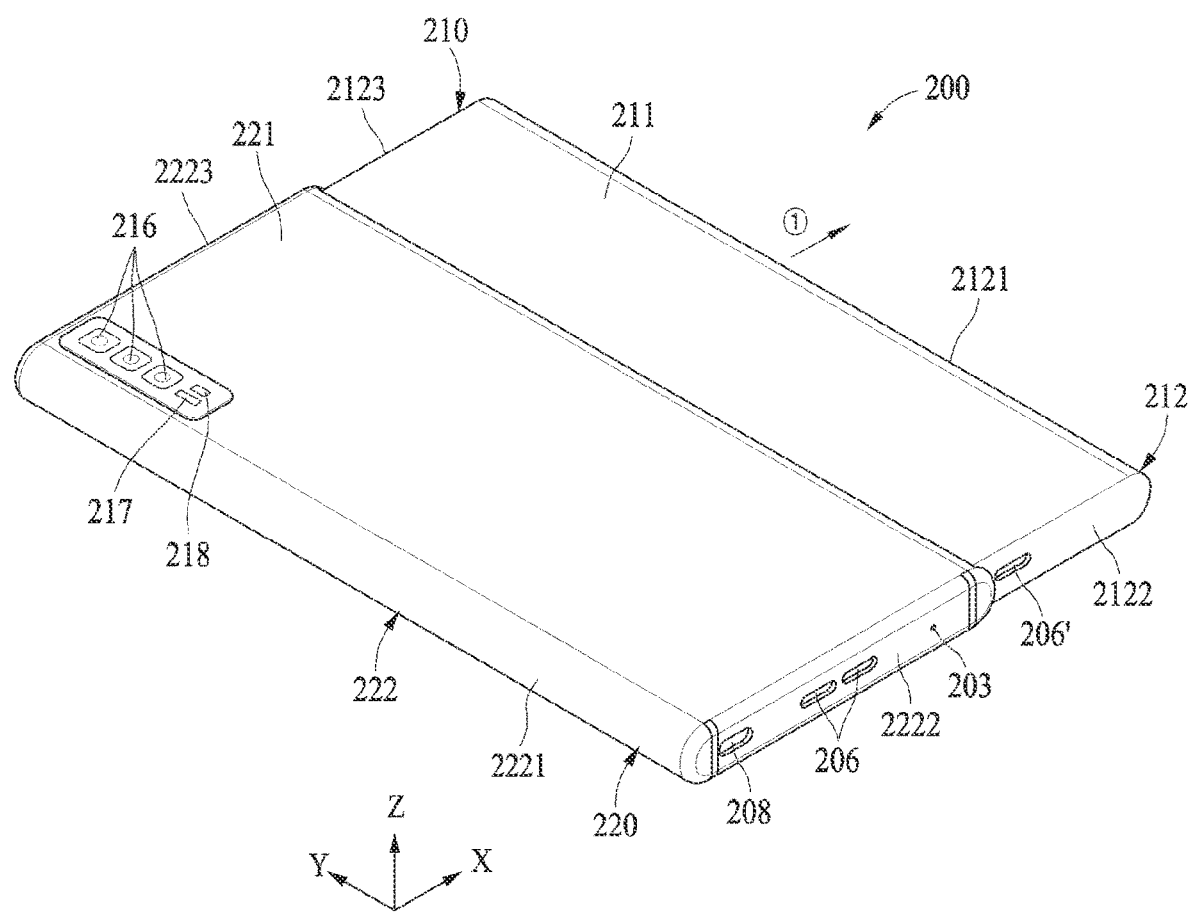
FIG. 2D is a rear perspective view illustrating the open state of the electronic device according to an example embodiment.

FIG. 2A is a front perspective view illustrating a closed state of an electronic device according to an example embodiment. FIG. 2B is a front perspective view illustrating an open state of the electronic device according to an example embodiment. FIG. 2C is a rear perspective view illustrating the closed state of the electronic device according to an example embodiment. FIG. 2D is a rear perspective view illustrating the open state of the electronic device according to an example embodiment.

Referring to FIGS. 2A, 2B, 2C and 2D (which may be referred to as FIGS. 2A to 2D), an electronic device 200 (e.g., the electronic device 101 of FIG. 1) may include a first housing 210 and a second housing 220 that is movably coupled to the first housing 210 at least in part.

In an example embodiment, the first housing 210 may include a first plate 211 and a first side frame 212 extending substantially in a vertical direction (e.g., +/−Z-axis direction) along a border of the first plate 211. In an example embodiment, the first side frame 212 may include a first side surface 2121, a second side surface 2122 extending from one end of the first side surface 2121, and a third side surface 2123 extending from the other end of the first side surface 2121. In an example embodiment, the first housing 210 may include a first space that is at least partially closed from the outside through the first plate 211 and the first side frame 212.

In an example embodiment, the second housing 220 may include a second plate 221 and a second side frame 222 extending substantially in a vertical direction (e.g., z-axis direction) along the border of the second plate 221. In an example embodiment, the second side frame 222 may include a fourth side surface 2221 facing in a direction opposite to the first side surface 2121, a fifth side surface 2222 extending from one end of the fourth side surface 2221 and at least partially coupled to the second side surface 2122, and a sixth side surface 2223 extending from the other end of the fourth side surface 2221 and at least partially coupled to the third side surface 2123. In an example embodiment, the fourth side surface 2221 may extend from a structure other than the second plate 221 and may also be coupled to the second plate 221. In an example embodiment, the second housing 220 may include a second space that is at least partially closed from the outside through the second plate 221 and the second side frame 222.

In an example embodiment, the first plate 211 and the second plate 221 may be disposed to at least partially form a rear surface of the electronic device 200. For example, the first plate 211, the second plate 221, the first side frame 212, and/or the second side frame 222 may be formed by a polymer, a coated or colored glass, ceramic, metal (e.g., aluminum, stainless steel (STS), or magnesium), or a combination of at least two of the materials.

In an example embodiment, the electronic device 200 may include a flexible display 230 disposed to be supported by the first housing 210 and the second housing 220. In an example embodiment, the flexible display 230 may include a planar part supported by the second housing 220 and a bendable part extending from the planar part and supported by the first housing 210. In an example embodiment, the bendable part of the flexible display 230 may be disposed not to be exposed to the outside in the first space of the first housing 210 when the electronic device 200 is in the closed state and may be exposed to the outside so as to extend from the planar part while being supported by the first housing 210 when the electronic device 200 is in the open state. For example, the electronic device 200 may be a rollable type in which a display screen of the flexible display 230 is expanded according to an opening operation by a movement of the first housing 210 from the second housing 220.

In an example embodiment, the first housing 210 may be at least partially inserted into the second space of the second housing 220 and movably coupled in the illustrated direction CD. For example, when the electronic device 200 is in the closed state, the first housing 210 and the second housing 220 may be maintained in a coupled state such that the first side surface 2121 and the fourth side surface 2221 have a first distance (d1). In an example embodiment, when the electronic device 200 is in the open state, the first housing 210 may be maintained to protrude from the second housing 220 such that the first side surface 2121 has a separation distance (d) protruding by the second distance (d2) from the fourth side surface 2221. In an example embodiment, the flexible display 230, in the open state, may be supported by the first housing 210 and/or the second housing 220 so that both ends have a curved edge formed in a curved shape.

In an example embodiment, the electronic device 200 may automatically transition to the open state and the closed state through an actuator (e.g., an actuator 330) disposed in the first space and/or the second space. For example, the processor (e.g., the processor 120 of FIG. 1) of the electronic device 200, when an event for transitioning to the open/closed state of the electronic device 200 is detected, may be set to control an operation of the first housing 210 through the actuator. In an example embodiment, the first housing 210 may manually protrude from the second housing 220 through manipulation of a user. The first housing 210 may protrude by a protrusion amount desired by the user, and accordingly, the screen of the flexible display 230 may also be variable to have various display areas. In an example embodiment, the processor (e.g., the processor 120 of FIG. 1) of the electronic device 200 may display an object in various ways and control to execute an application program corresponding a display area corresponding to a certain protrusion amount of the first housing 210.

In an example embodiment, the electronic device 200 may include at least one of an input device 203, audio output devices 206 and 207, sensor modules 204 and 217, camera modules 205 and 216, a connector port 208, a key input device (not shown), and an indicator (not shown). In an example embodiment, the electronic device 200 may not include at least one of the aforementioned components or may additionally include other components.

In an example embodiment, the input device 203 may include a microphone 203. In an example embodiment, the input device 203 may include a plurality of microphones 203 disposed to detect a direction of sound. The sound output devices 206 and 207 may include speakers 206 and 207. For example, the speakers 206 and 207 may include an external speaker 206 and a receiver for a call 207. In an example embodiment, when an external speaker 206' is disposed in the first housing 210, sound may be output through a speaker hole 206 formed in the second housing 220 in the closed state. In an example embodiment, the microphone 203 or the connector port 208 may also be formed to have substantially the same configuration. In an example embodiment, the sound output devices 206 and 207 may include a speaker (e.g., a piezo speaker) that operates while not including a separate speaker hole 206.

In an example embodiment, the sensor modules 204 and 217 may generate an electrical signal or data value corresponding to an internal operating state of the electronic device 200 or an external environmental state. The sensor modules 204 and 217, for example, may include a first sensor module 204 (e.g., the proximity sensor or an illumination sensor) disposed on a front surface of the second housing 220 and/or a second sensor module 217 (e.g., an HRM sensor) disposed on a rear surface of the second housing 220. In an example embodiment, the first sensor module 204 may be disposed under the flexible display 230 in the second housing 220. In an example embodiment, the first sensor module 204 may include at least one of the proximity sensor, the illumination sensor 204, a time of flight (TOF) sensor, an ultrasonic sensor, a fingerprint recognition sensor, a gesture sensor, a gyro sensor, a pressure sensor, a magnetic sensor, an acceleration sensor, a grip sensor, a color sensor, an infrared (IR) sensor, a biometric sensor, and a temperature sensor and a humidity sensor.

In an example embodiment, the camera devices 205 and 216 may include the first camera device 205 disposed on a front surface of the second housing 220 of the electronic device 200 and the second camera device 216 disposed on a rear surface of the second housing 220. In an example embodiment, the electronic device 200 may include a flash 218 located near the second camera device 216. In an example embodiment, the camera devices 205 and 216 may include one or a plurality of lenses, an image sensor, and/or an image signal processor. In an example embodiment, the first camera device 205 may be disposed under the flexible display 230 and configured to take a picture of a subject through a part of an activation area of the flexible display 230. In an example embodiment, the flash 218, for example, may include a light emitting diode or a xenon lamp. In an example embodiment, two or more lenses (a wide-angle lens and a telephoto lens) and the image sensor may be disposed on one surface of the electronic device 200.

In an example embodiment, the electronic device 200 may include at least one antenna (not shown). In an example embodiment, at least one antenna, for example, may wirelessly communicate with the external electronic device (e.g., the electronic device 104 of FIG. 1) or wirelessly transmit and receive power required for charging. In an example embodiment, the antenna may include a legacy antenna, a mmWave antenna, a near field communication (NFC) antenna, a wireless charging antenna, and/or a magnetic secure transmission (MST) antenna. In an example embodiment, an antenna structure may be formed through at least a part of the first side frame 212 and/or the second side frame 222 formed of metal.

Figure 3A:
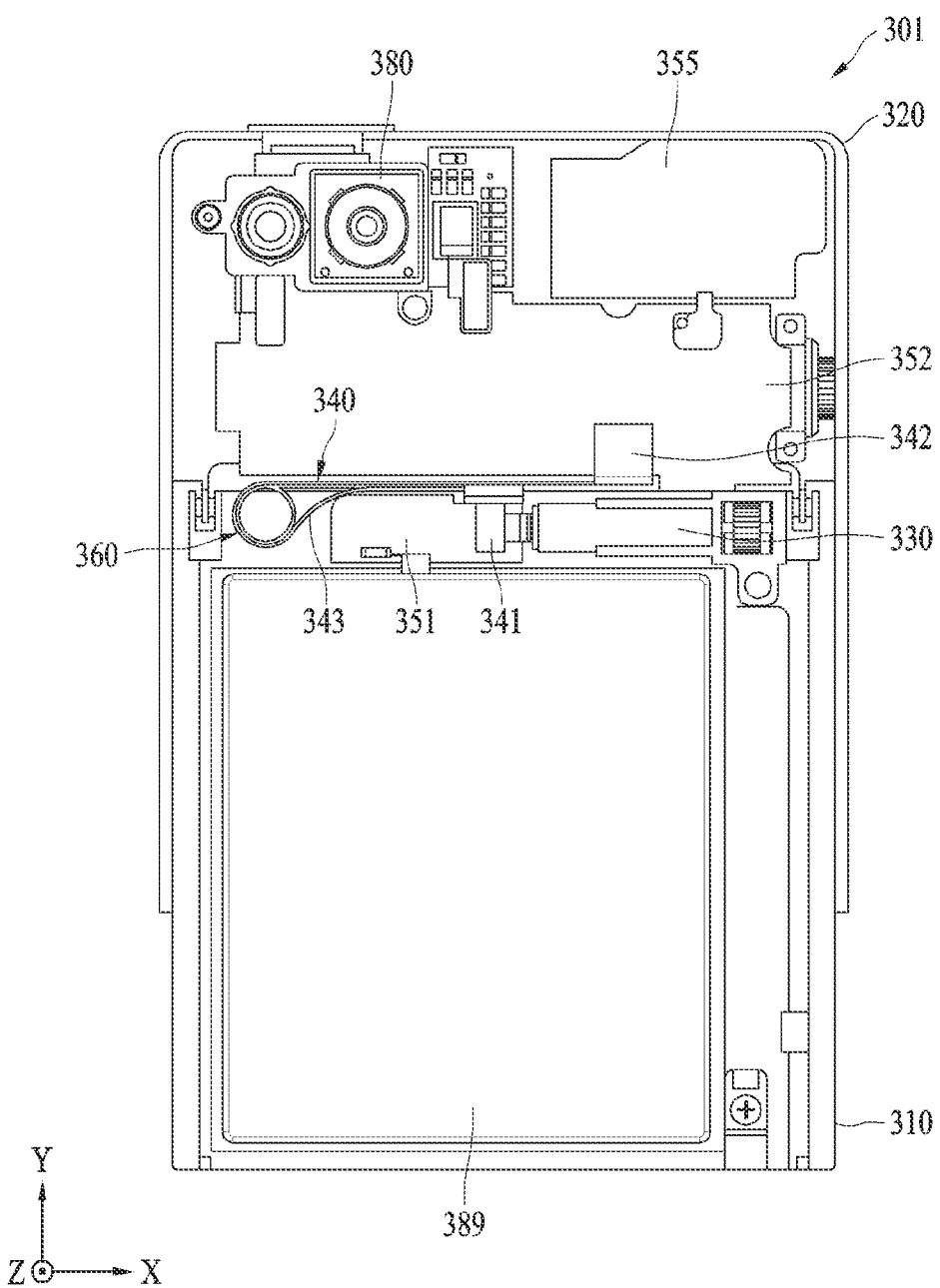
FIG. 3A is a diagram illustrating the closed state of the electronic device according to an example embodiment.
Figure 3B:
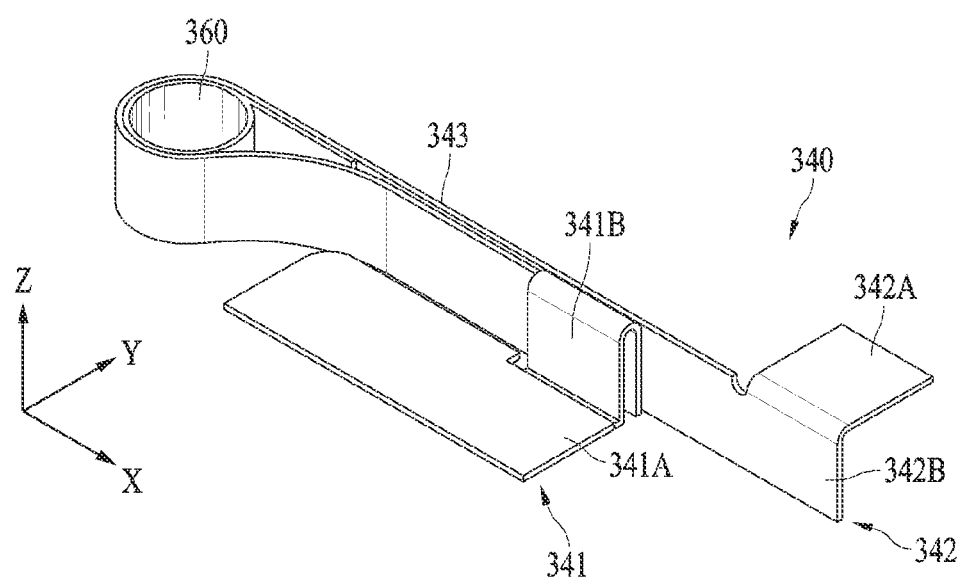
FIG. 3B is a perspective view illustrating a connecting assembly in a folded form in the electronic device in the closed state according to an example embodiment.
Figure 3C:
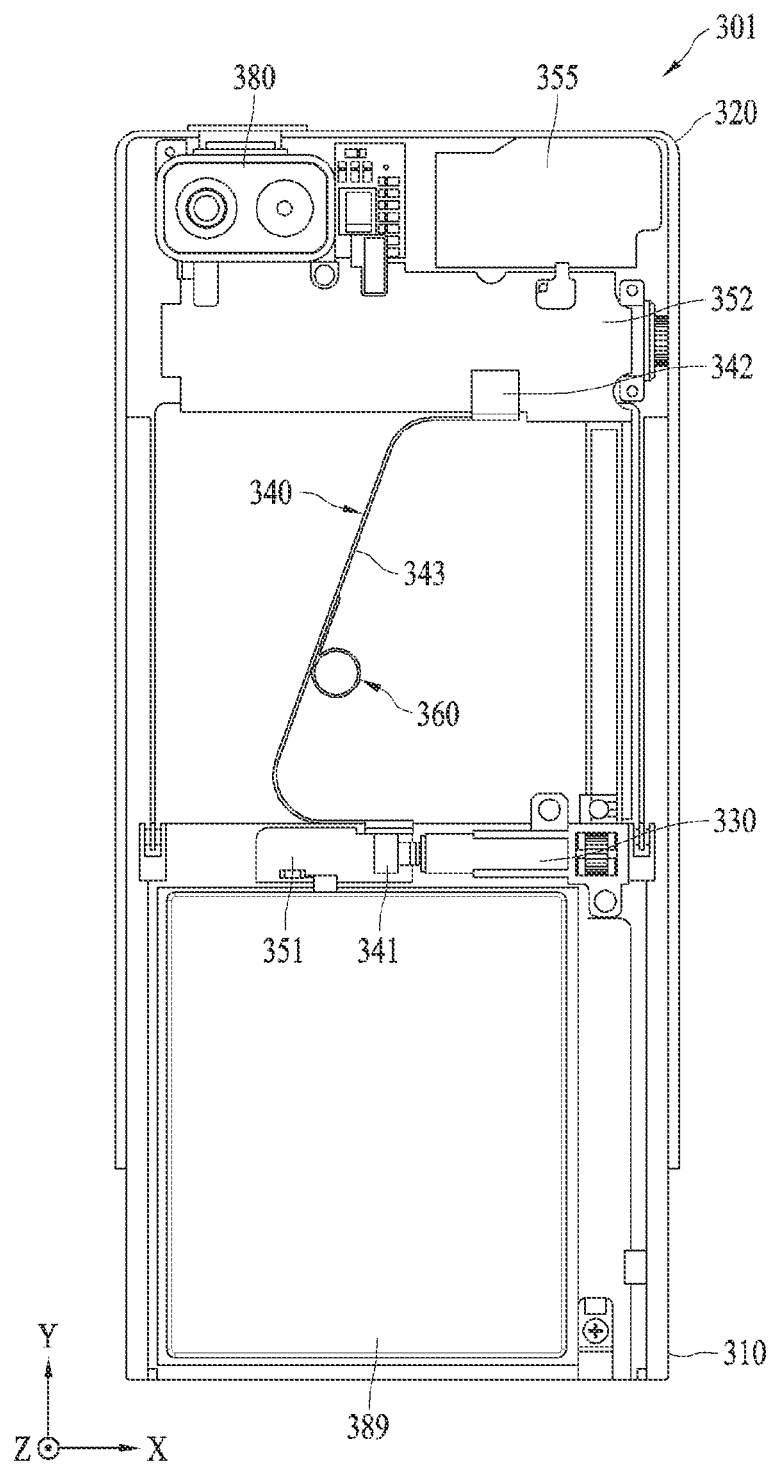
FIG. 3C is a diagram illustrating the open state of the electronic device according to an example embodiment.
Figure 3D:
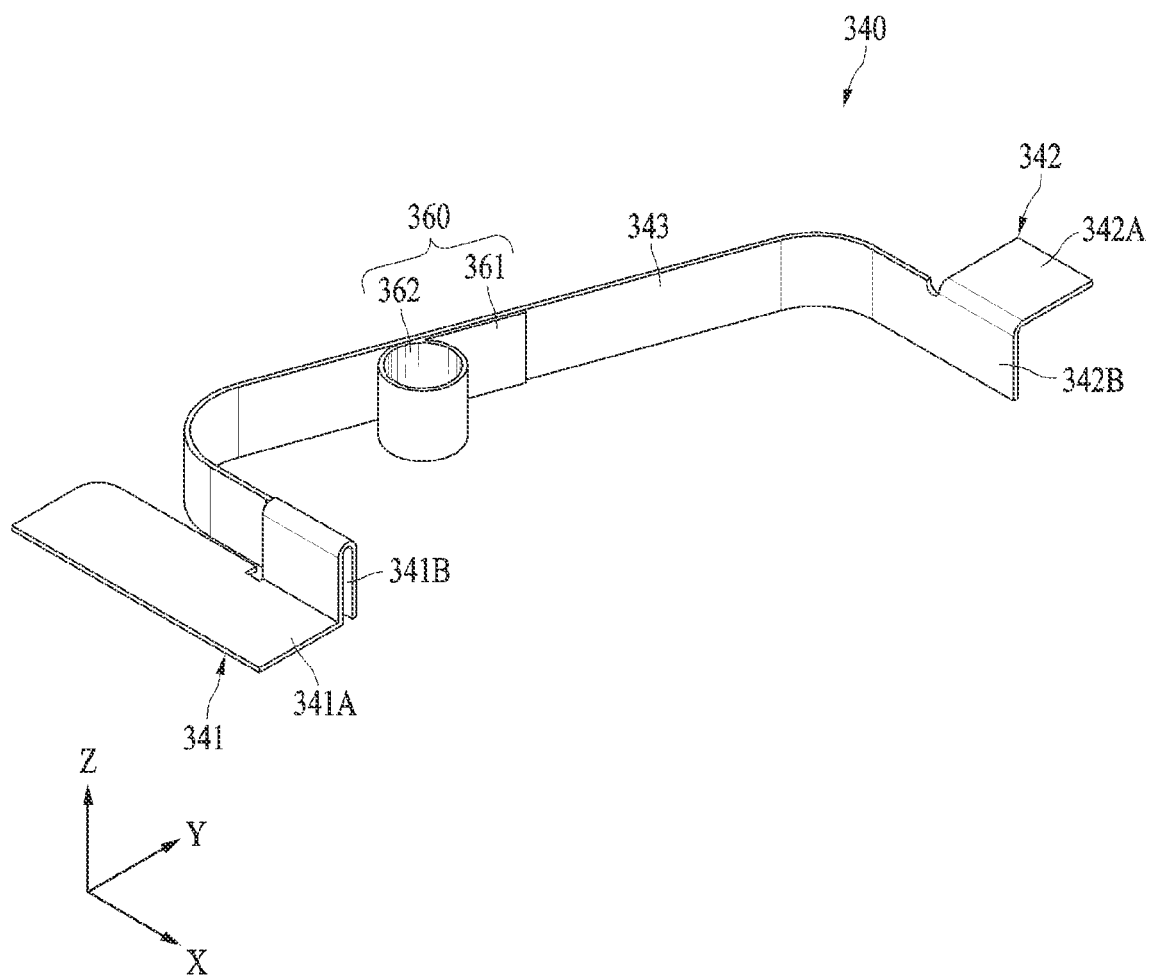
FIG. 3D is a perspective view illustrating the connecting assembly in an unfolded form in the electronic device in the open state according to an example embodiment.
Figure 3E:
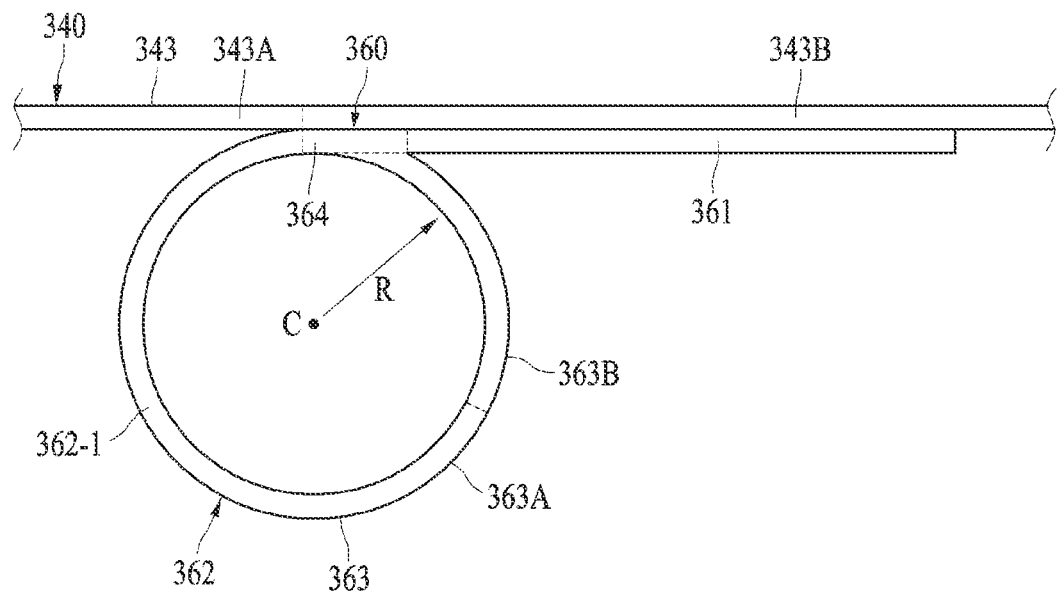
FIG. 3E is a diagram illustrating a guide structure located on a flexible printed circuit board according to an example embodiment.
Figure 3F:
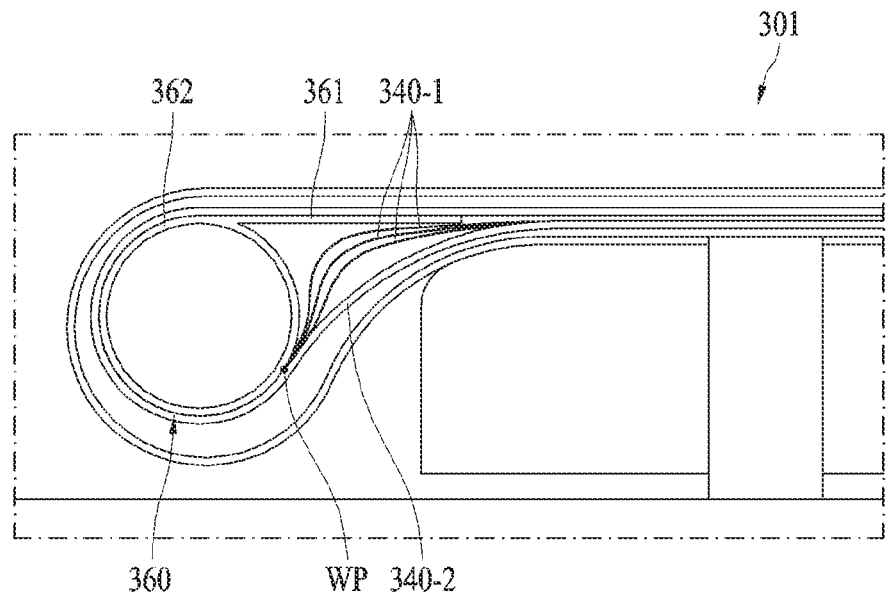
FIG. 3F is a diagram illustrating the connecting assembly in the folded form in the electronic device in the closed state according to an example embodiment.
Figure 3G:
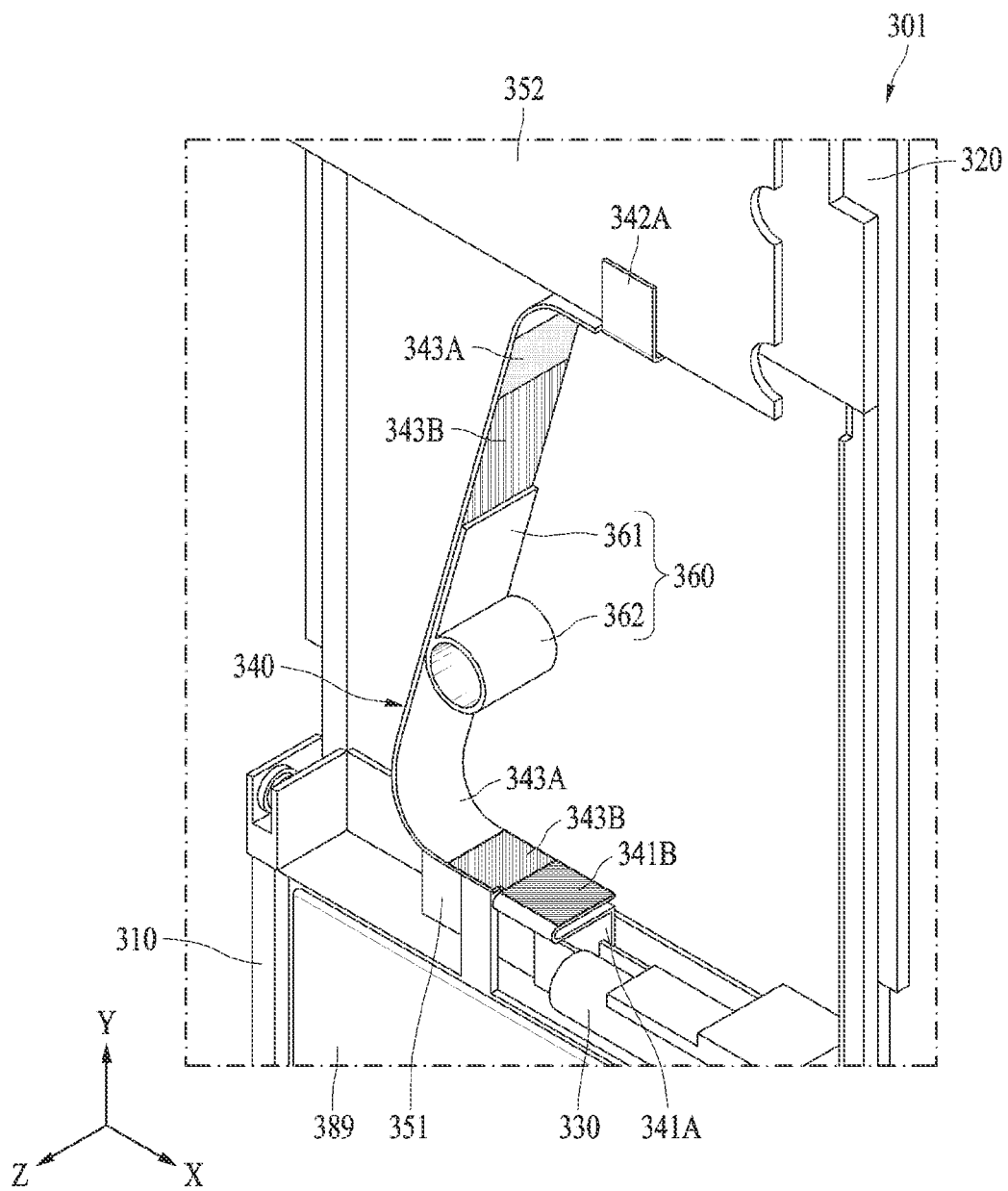
FIG. 3G is a perspective view illustrating the connecting assembly viewed in one direction according to an example embodiment.
Figure 3H:
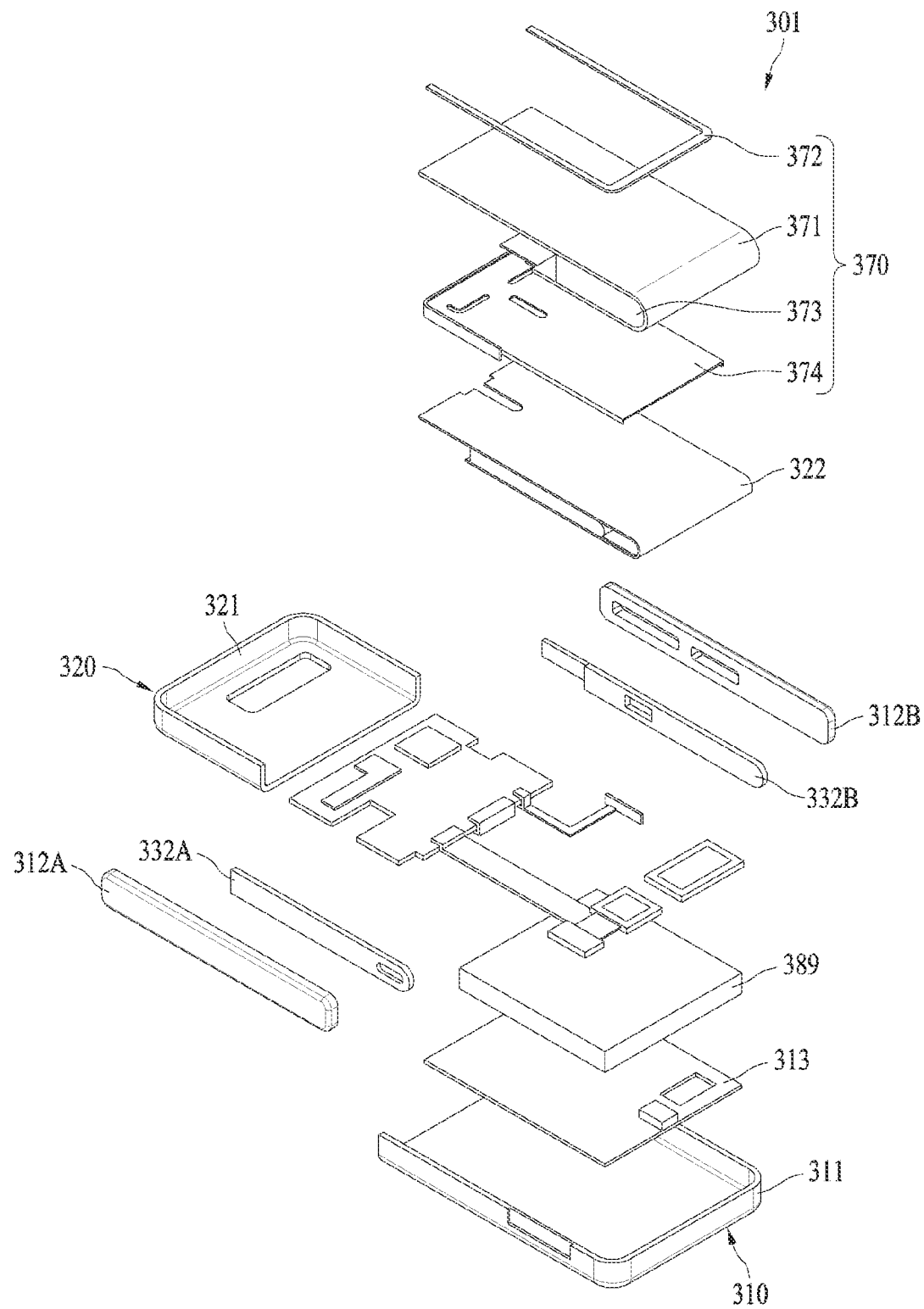
FIG. 3H is an exploded perspective view illustrating the electronic device according to an example embodiment.
Figure 3I:
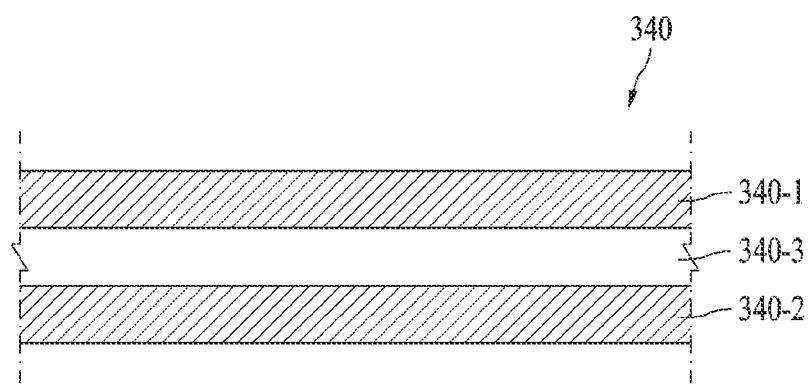
FIG. 3I is a cross-sectional view illustrating a stacked layer of the connecting assembly according to an example embodiment.

FIG. 3A is a diagram illustrating the closed state of the electronic device according to an example embodiment. FIG. 3B is a perspective view illustrating a connecting assembly in a folded form in the electronic device in the closed state according to an example embodiment. FIG. 3C is a diagram illustrating the open state of the electronic device according to an example embodiment. FIG. 3D is a perspective view illustrating the connecting assembly in an unfolded form in the electronic device in the open state according to an example embodiment. FIG. 3E is a diagram illustrating a guide structure located on a flexible printed circuit board according to an example embodiment. FIG. 3F is a diagram illustrating the connecting assembly in the folded form in the electronic device in the closed state according to an example embodiment. FIG. 3G is a perspective view illustrating the connecting assembly viewed in one direction according to an example embodiment. FIG. 3H is an exploded perspective view illustrating the electronic device according to an example embodiment. FIG. 3I is a cross-sectional view illustrating a stacked layer of the connecting assembly according to an example embodiment.

Referring to FIGS. 3A, 3B, 3C, 3D, 3E, 3F, 3G, 3H and 3I (which may be referred to as FIGS. 3A to 3I), an electronic device 301 (e.g., the electronic device 200 of FIGS. 2A to 2D) according to an example embodiment may include a first housing 310 (e.g., the first housing 210) and a second housing 320 (e.g., the second housing 220). The first housing 310 and the second housing 320 may be configured to move relative to each other. For example, the electronic device 301 may change shape between the open state in which the second housing 320 moves in a first direction (e.g., +Y direction) with respect to the first housing 310 and the closed state in which the second housing 320 moves in the second direction (e.g., −Y direction) different from the first direction with respect to the first housing 310.

The first housing 310 may include at least one first electronic component. For example, a first electronic component may include the actuator 330, a battery 389 (e.g., the battery 189), and/or other electronic components. The first housing 310 may include a first printed circuit board 351 in which at least one first electronic component is disposed or to which at least one first electronic component is connected.

The first housing 310 may include a first cover 311, a first side member 312A connected to, accessed to, or coupled to any one side surface of the first cover 311, a second side member 312B connected to, accessed to, or coupled to the other side surface of the first cover 311, and a first support plate 313 located in the first cover 311 and configured to support at least one first electronic component (e.g., the battery 389).

The second housing 320 may include at least one second electronic component. For example, the second electronic component may include a speaker module 355 (e.g., the sound output module 155), a camera module 380 (e.g., the camera module 180), and/or other electronic components. The second housing 320 may include a second printed circuit board 352 in which at least one second electronic component is disposed or to which at least one second electronic component is connected.

The second housing 320 may include a second cover 321, and a second plate 322 located at least partially on the second cover 321 and configured to support a display module 370 and/or protect an electronic component located in the first housing 310 and/or the second housing 320.

The electronic device 301 may include the display module 370 (e.g., the display module 160 of FIG. 1). The display module 370 may include at least partially wound or rolled flexible display 371, a border member 372 at least partially overlapping a peripheral part of the display 371, a supporting joint structure 373 configured to support winding or rolling of the display 371, and a third support plate 374 configured to support the supporting joint structure 373 and/or the display 371.

The electronic device 301 may include a first rail 332A located between the first cover 311 and the first side member 312A and connected to the first side of the display 371 to expand or reduce the area of the display 371, and a second rail 332B located between the first cover 311 and the second side member 312B and connected to a second side opposite to the first side of the display 371 to expand or reduce an area of the display 371.

The electronic device 301 may include a connecting assembly 340 configured to connect at least one first electronic component and at least one second electronic component. For example, the connecting assembly 340, by connecting the first printed circuit board 351 and the second printed circuit board 352, may electrically connect at least one first electronic component (e.g., the actuator 330 and/or the battery 389) disposed on the first printed circuit board 351 or connected to the first printed circuit board 351, and at least one second electronic component (e.g., the speaker module 355 and/or the camera module 380) disposed on the second printed circuit board 352 or connected to the second printed circuit board 352.

In an example embodiment, the connecting assembly 340 may include a first part 341 connected to the first printed circuit board 351, a second part 342 connected to the second printed circuit board 352, and a third part 343 between the first part 341 and the second part 342.

In an example embodiment, the first part 341 may include a first connector area 341A configured to be connected to the first printed circuit board 351 and a first base area 341B configured to connect the first connector area 341A and the third part 343. In an example embodiment, the first connector area 341A and the first base area 341B may each be oriented in a direction that crosses (e.g., orthogonal) the other. In an example embodiment, the first connector area 341A and the first base area 341B may be bent with respect to each other. For example, the first connector area 341A and/or the first base area 341B may be at least partially formed of a flexible material. In an example embodiment, the first base area 341B may be substantially planar.

In an example embodiment, the second connector part 342 may include a second connector area 342A configured to be connected to the second printed circuit board 352 and a second base area 342B configured to connect the second connector area 342A and the third part 343. In an example embodiment, the second connector area 342A and the second base area 342B may each be oriented in a direction that crosses (e.g., orthogonal) the other. In an example embodiment, the second connector area 342A and the second base area 342B may be bent with respect to each other. For example, the second connector area 342A may be at least partially formed of the flexible material and the second base area 342B may be at least partially formed of a rigid material. In an example embodiment, the second base area 342B may have a plurality of folding areas connected to each other to be foldable.

In an example embodiment, the third part 343 may include a flexible area 343A and a rigid area 343B. The flexible area 343A and the rigid area 343B may substantially form the third part 343. In an example embodiment, the third part 343 may include a plurality of flexible areas 343A and at least one rigid area 343B between the plurality of flexible areas 343A. In an example embodiment, the third part 343 may include a plurality of rigid areas 343B and at least one flexible area 343A between the plurality of rigid areas 343B. In an example embodiment, the third part 343 may include the plurality of flexible areas 343A and the rigid areas 343B connected to each other. In an example embodiment, some flexible areas 343A may be connected to the second base area 342B and some rigid areas 343B may be connected to the first base area 341B.

In an example embodiment, the connecting assembly 340 may have a shape that varies according to a state change of the electronic device 301. For example, the connecting assembly 340 may change shape between a folded form in which at least some areas of the surface face inward towards each other and substantially face each other through the folding of one surface (e.g., an inner side) of the third part 343 in the open state in which the second housing 320 moves in the first direction (e.g., +Y direction) with respect to the first housing 310, and an unfolded form in which at least some areas of the surface face outward away from each other and do not substantially face each other through the spreading of one surface (e.g., the inner side) of the third part 343 in the closed state in which the second housing 320 moves in the second direction (e.g., −Y direction) different from the first direction with respect to the first housing 310. In an example embodiment, the connecting assembly 340, in the folded form, may be bent inward to have a substantially constant radius of curvature.

In an example embodiment, the connecting assembly 340 may be a printed circuit board or may include a printed circuit board. In an example embodiment, the connecting assembly 340 may be a flexible printed circuit board or may include a flexible printed circuit board. For example, the connecting assembly 340 may include a plurality of metal layers 340-1 and 340-2, and at least one dielectric layer 340-3 located between adjacent metal layers 340-1 and 340-2 or on one surface of the metal layers 340-1.

In an example embodiment, in the rigid area 343B, the plurality of layers 340-1, 340-2, and 340-3 may be formed to be rigid. For example, in the rigid area 343B, the plurality of layers 340-1, 340-2, and 340-3 may be formed in a prepreg method. In an example embodiment, in the rigid area 343B, at least some of the plurality of layers 340-1, 340-2, and 340-3 may be formed to be rigid, and the others may be formed to be flexible.

In an example embodiment, the plurality of metal layers 340-1 and 340-2, in the folded form of the connecting assembly 340, may include at least one first metal layer 340-1 located relatively inside and at least one second metal layer 340-2 located relatively outside.

The electronic device 301, when the state changes from the open state (e.g., FIG. 3C) to the closed state (e.g., FIG. 3A), may include a guide structure (e.g., a guide) 360 configured to maintain the folded form (e.g., FIG. 3B) of the connecting assembly 340 substantially constant by guiding at least a part of the connecting assembly 340. The guide structure 360, for example, by guiding the connecting assembly 340 so that the connecting assembly 340 has a substantially constant radius of curvature while in folded form, may be configured to reduce or prevent a possible effect (e.g., cracking) on the connecting assembly 340 due to the electronic device 301 being repeatedly transitioned between the open state and the closed state.

In an example embodiment, the guide structure 360 may include a base 361 configured to be connected to, accessed to, or coupled (e.g., attached) to the connecting assembly 340, and a guide 362 configured to be connected to, accessed to, or coupled to the base 361 and configured to guide at least a part of the connecting assembly 340 while the connecting assembly 340 changes shape between the folded form (e.g., FIG. 3B) and the unfolded form (e.g., FIG. 3D).

In an example embodiment, the guide 362 may be directly connected to, accessed to, or coupled (e.g., attached) to the connecting assembly 340 without an intermediate component (e.g., base 361).

In an example embodiment, the base 361 may have a substantially flat shape. In an example embodiment, the base 361 may be configured to have substantially the same form in the folded form (e.g., FIG. 3B) and the unfolded form (e.g., FIG. 3D) of the connecting assembly 340. In an example embodiment, the base 361 may have at least a partially curved surface.

In an example embodiment, the base 361 may be located in the rigid area 343B. In an example embodiment, the base 361 may be located at a boundary (e.g., the end of the rigid area 343B) of the rigid area 343B adjacent to the flexible area 343A in the rigid area 343B. In an example embodiment, the base 361 may not be substantially located in the flexible area 343A. In an example embodiment, the base 361 may be at least partially located in the flexible area 343A.

In an example embodiment, the base 361 may be located to substantially overlap the rigid area 343B. In an example embodiment, the width of the base 361 may be substantially the same as the width of the rigid area 343B. In an example embodiment, the width of the base 361 may be smaller than the width of the rigid area 343B.

In an example embodiment, the base 361 may be formed of the rigid material. In an example embodiment, the base 361 may be at least partially formed of the flexible material.

In an example embodiment, the guide 362 may include a guide area 363 guiding at least a part (e.g., the flexible area 343A) of the connecting assembly 340, and a connecting area 364 connecting the base 361 and the guide area 363.

In an example embodiment, the guide area 363 may be connected to the base 361 so as not to be fixed to the flexible area 343A of the connecting assembly 340. In an example embodiment, the guide area 363 may be located inside the connecting assembly 340 in the folded form of the connecting assembly 340.

In an example embodiment, in the folded form (e.g., FIG. 3A) of the connecting assembly 340, the plurality of metal layers 340-1 and 340-2 may surround a portion of the guide area 363 (e.g., a contact area 363A) and may be bent at least partially inward to have a substantially constant radius of curvature. In an example embodiment, in the folded form of the connecting assembly 340, at least one first metal layer 340-1 among the plurality of metal layers 340-1 and 340-2 may be configured to be at least partially wrinkled from the at least one second metal layer 340-2 at a wrinkle start point (WP). While the connecting assembly 340 repeatedly changes shape between the folded form and the unfolded form, the wrinkle start point (WP) may be located substantially at the same place on the guide area 363.

In an example embodiment, the guide area 363 may have a substantially curved surface. In an example embodiment, the guide area 363 may have a circular arc shaped curved surface having substantially the same radius of curvature (R). In an example embodiment, the guide area 363 may form a closed curved surface having substantially the same radius of curvature (R) from the virtual center. In other words, the guide area 363 may have a substantially constant curvature along the curved surface. In an example embodiment, the guide area 363 may form the closed curved surface having a variable radius of curvature (R). In an example embodiment, the radius of curvature formed by a part of the guide area 363 may be different from the radius of curvature formed by another part of the guide area 363.

In an example embodiment, the guide area 363 may be formed as a substantially continuous curved surface. In an example embodiment, the guide area 363 may be formed by spacing a plurality of continuous surfaces forming at least one curved surface apart from each other.

In an example embodiment, a center (C) of the curved surface formed by the guide area 363 may be located on the connecting area 364 and/or on the area of the base 361 to which the connecting area 364 is connected, accessed, or coupled. In an example embodiment, the center (C) may be located on the base 361 offset by a predetermined distance from the end of the base 361. In an example embodiment, the center (C) may be located on the end of the base 361.

In an example embodiment, a material of an edge 362-1 (e.g., a side edge) that does not face the flexible area 343A and/or the rigid area 343B may be formed to be more flexible than a material of the guide area 363 that substantially form the curved surface and the connecting area 364.

In an example embodiment, the guide area 363 may include a contact area 363A which is connected to one side (e.g., a left side of FIG. 3E) of the connecting area 364 and is substantially in contact with at least a part (e.g., the flexible area 363A) of the connecting assembly 340, and a non-contact area 363B which is connected to the other side (e.g., a lower side in FIG. 3E) of the connecting area 364 and to the contact area 363A, respectively, and is not substantially in contact with the connecting assembly 340.

In an example embodiment, the length of the contact area 363A in the circumferential direction may be greater than the length of the non-contact area 363B in the circumferential direction. In an example embodiment, the length of the contact area 363A in a circumferential direction may be substantially equal to the length of the non-contact area 363B in the circumferential direction. In an example embodiment, the length of the contact area 363A in the circumferential direction may be shorter than the length of the non-contact area 363B in the circumferential direction.

In an example embodiment, the surface roughness of the contact area 363A may be less than the surface roughness of the non-contact area 363B. Making the surface roughness of the contact area 363A relatively less than the surface roughness of the non-contact area 363B may reduce or prevent friction with at least a part (e.g., the first metal layer 340-1) of the connecting assembly 340 in contact with the contact area 363A while the connecting assembly 340 repeatedly changes shape between the folded form and the unfolded form.

In an example embodiment, the connecting area 364 may be located in the edge area (e.g., the end) of the base 361. In an example embodiment, the connecting area 364 may be located in the inner area offset by a set distance from the edge of the base 361.

In an example embodiment, the material of the connecting area 364 may be formed to be more flexible than the material of the guide area 363. Forming the material of the connecting area 364 to be relatively flexible may reduce or prevent a possible effect (e.g., cracking) on the connecting assembly 340 that may occur as a result of the connecting assembly 340 repeatedly changing shape between the folded form and the unfolded form. In an example embodiment, at least a part (e.g., a part of the guide area 363 connected to the connecting area 364) of the guide area 363 may be formed to be flexible. In an example embodiment, both the guide area 363 and the connecting area 364 may be substantially formed of the rigid material.

Meanwhile, herein, the connecting assembly 340 is described as a component distinguished from the guide structure 360, but is not limited thereto, and the connecting assembly 340 may include the guide structure 360. For example, the connecting assembly 340 may include the flexible printed circuit board including the component of the connecting assembly 340 as described above and the guide structure 360 located on the flexible printed circuit board. In an example embodiment, the flexible printed circuit board and the guide structure 360 may be integrally and seamlessly formed with each other. In an example embodiment, the flexible printed circuit board and the guide structure 360 may be connected to, accessed to, and/or coupled to each other.

Figure 4A:
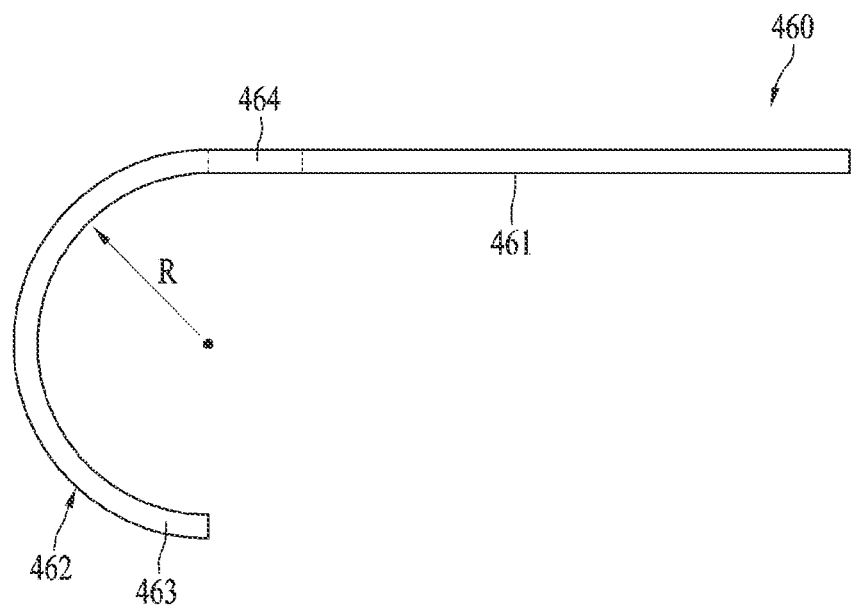
FIG. 4A is a diagram illustrating the guide structure according to an example embodiment.
Figure 4B:
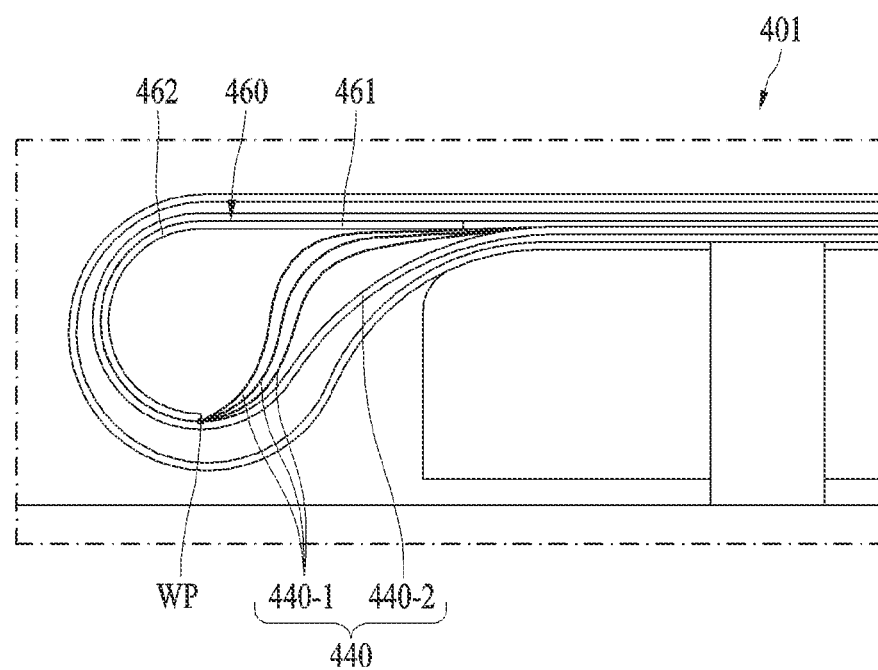
FIG. 4B is a diagram illustrating the connecting assembly to which the guide structure of FIG. 4A is applied according to an example embodiment.

FIG. 4A is a diagram illustrating the guide structure according to an example embodiment. FIG. 4B is a diagram illustrating the connecting assembly to which the guide structure of FIG. 4A is applied according to an example embodiment.

Referring to FIGS. 4A and 4B, a guide structure 460 (e.g., the guide structure 360) according to an example embodiment may include a base 461 (e.g., the base 361) and a guide 462. The guide 462 may include a guide area 463 (e.g., the guide area 363) and a connecting area 464 (e.g., the connecting area 364). In an example embodiment, the guide area 463 may form at least a partially open curved surface. For example, the guide area 463 may form a semicircular curved surface having substantially the same radius of curvature (R). When a connecting assembly 440 (e.g., the connecting assembly 340) in an electronic device 401 (e.g., the electronic device 301) is in a folded form, a plurality of layers 440-1 and 440-2 (e.g., the first metal layer 340-1 and the second metal layer 340-2) of the connecting assembly 440 may be bent to have substantially the same radius of curvature along the guide area 463. When the connecting assembly 440 is in a folded form, at least one first layer 440-1 of the plurality of layers 440-1 and 440-2 may be configured to be wrinkled from at least one second layer 440-2 at the wrinkle start point (WP) located on the end of the guide area 463.

Figure 5:
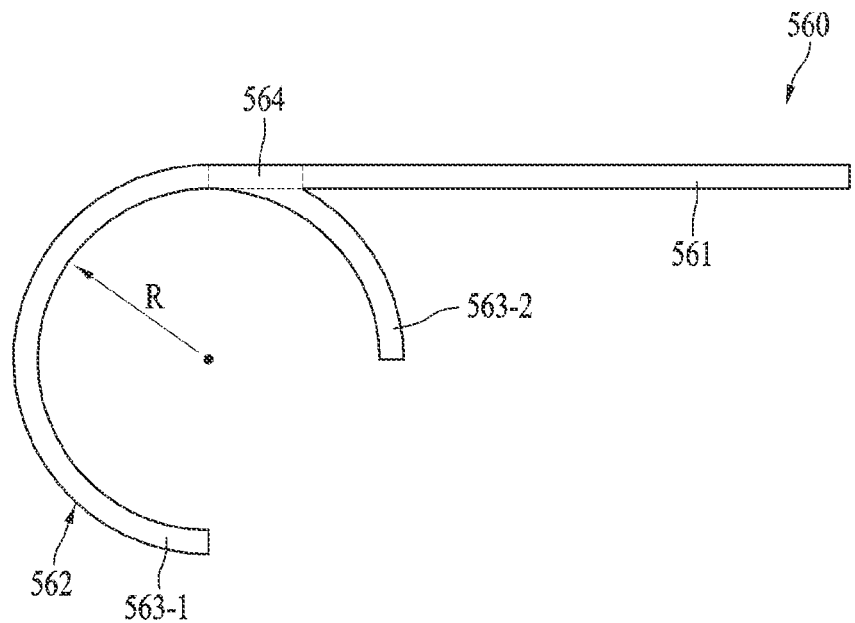
FIG. 5 is a diagram illustrating the guide structure according to an example embodiment.

FIG. 5 is a diagram illustrating the guide structure according to an example embodiment.

Referring to FIG. 5, a guide structure 560 (e.g., the guide structure 360) according to an example embodiment may include a base 561 (e.g., the base 361) and a guide 562 (e.g., the guide 362). The guide 562 may include guide areas 563-1 and 563-2 (e.g., the guide area 363) and a connecting area 564 (e.g., the connecting area 364). In an example embodiment, the guide 562 may include a first guide area 563-1 connected to one side (e.g., the left side in FIG. 5) of the connecting area 564 and a second guide area 563-2 connected to the other side (e.g., the right side in FIG. 5) of the connecting area 564. In an example embodiment, the first guide area 563-1 and the second guide area 563-2 may form an open curved surface having substantially the same radius of curvature (R). In an example embodiment, the first guide area 563-1 and the second guide area 563-2 may form a curved surface of substantially about 270 degrees. In an example embodiment, the length of the first guide area 563-1 in the circumferential direction may be substantially equal to or longer than the length of the second guide area 563-2 in the circumferential direction.

Figure 6:
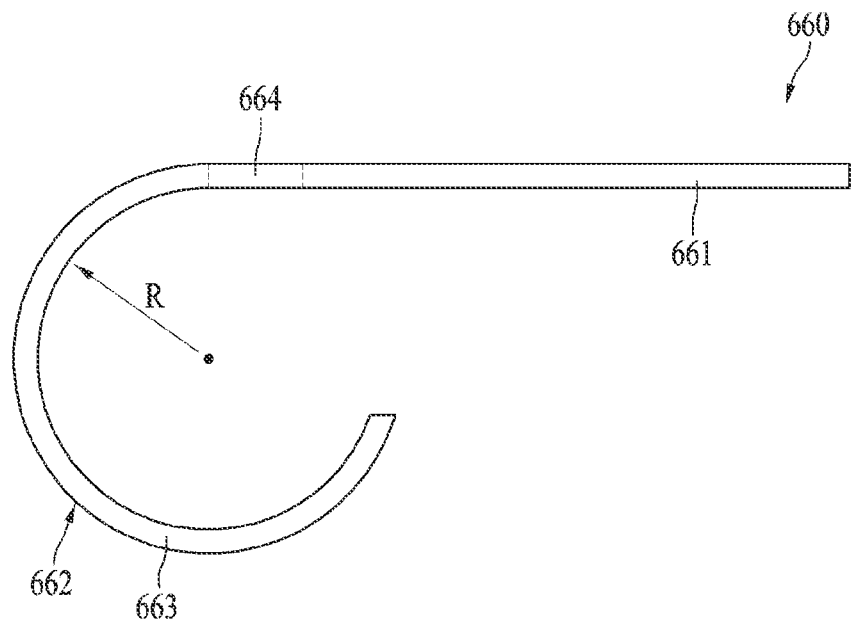
FIG. 6 is a diagram illustrating the guide structure according to an example embodiment.

FIG. 6 is a diagram illustrating the guide structure according to an example embodiment.

Referring to FIG. 6, a guide structure 660 (e.g., the guide structure 360) according to an example embodiment may include a base 661 (e.g., the base 361) and a guide 662 (e.g., the guide 362). The guide 662 may include a guide area 663 (e.g., the guide area 363) and a connecting area 664 (e.g., the connecting area 364). In an example embodiment, the guide area 663 may form an open curved surface having substantially the same radius of curvature (R). In an example embodiment, the guide area 663 may form a curved surface of between substantially about 180 degrees and about 270 degrees.

Figure 7:
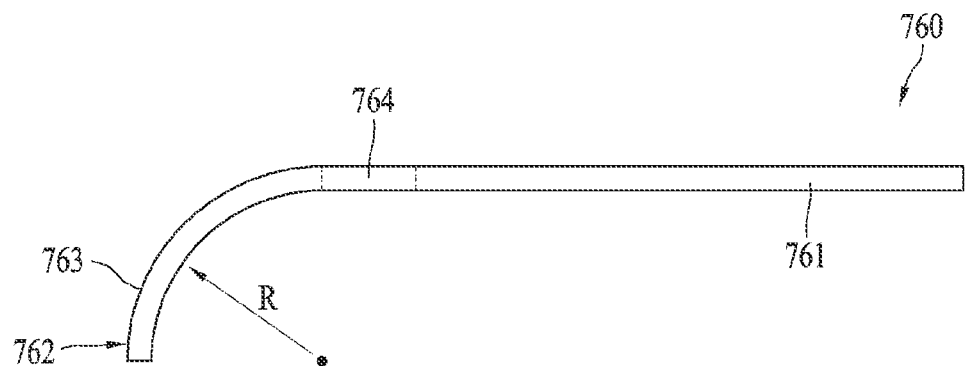
FIG. 7 is a diagram illustrating the guide structure according to an example embodiment.

FIG. 7 is a diagram illustrating the guide structure according to an example embodiment.

Referring to FIG. 7, a guide structure 760 (e.g., the guide structure 360) according to an example embodiment may include a base 761 (e.g., the base 361) and a guide 762 (e.g., the guide 362). The guide 762 may include a guide area 763 (e.g., the guide area 363) and a connecting area 764 (e.g., the connecting area 364). In an example embodiment, the guide area 763 may form an open curved surface having substantially the same radius of curvature (R). In an example embodiment, the guide area 763 may form a curved surface of substantially about 120 degrees.

Figure 8:
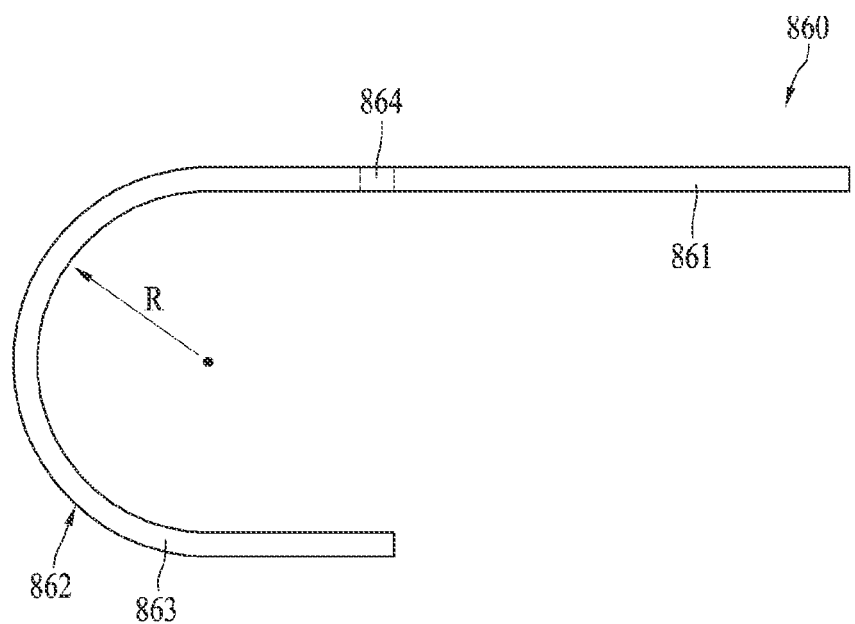
FIG. 8 is a diagram illustrating the guide structure according to an example embodiment.

FIG. 8 is a diagram illustrating the guide structure according to an example embodiment.

Referring to FIG. 8, a guide structure 860 (e.g., the guide structure 360) according to an example embodiment may include a base 861 (e.g., the base 361) and a guide 862 (e.g., the guide 362). The guide 862 may include a guide area 863 (e.g., the guide area 363) and a connecting area 864 (e.g., the connecting area 364). In an example embodiment, the guide area 863 may form an open curved surface having a variable radius of curvature (R). For example, the guide area 863 may form a substantially U-shaped curved surface (e.g., a parabolic curved surface).

A connecting assembly configured to connect an electronic component located in each of housings configured to move in a different direction may have a shape that varies according to a distance between the housings. Repetitive movement of the housing may affect the connecting assembly. An aspect of the disclosure provides an electronic device including a connecting assembly able to keep a change in shape constant while the housing is repeatedly moved.

The electronic device according to an example embodiment may include: a first housing including a first printed circuit board (PCB), a second housing including a second PCB and configured to move in a first direction and a second direction different from the first direction with respect to the first housing, a flexible printed circuit board (FPCB) including a first part connected to the first PCB, a second part connected to the second PCB, and a third part between the first part and the second part, the third part may include a rigid area and a flexible area, configured to change shape between the folded form in which the FPCB is folded inward while the second housing is moving in the first direction and the unfolded form in which the FPCB is unfolded outward while the second housing is moving in the second direction, and a guide at least partially coupled to the rigid area, and located inside the FPCB and configured to guide the flexible area based on the FPCB being in the folded form.

In an example embodiment, the guide may be connected to a rigid area to not be fixed to the flexible area.

In an example embodiment, the guide may further include a base located in the rigid area and configured to connect the rigid area and the guide.

In an example embodiment, the guide may include a guide area having a substantially curved surface.

In an example embodiment, the guide area may include one of a closed curved surface, an open curved surface, and a substantially U-shaped curved surface.

In an example embodiment, the curved surface may have a substantially constant curvature radius along the curved surface.

In an example embodiment, the guide may include a guide area configured to guide the flexible area, and a connecting area configured to connect the guide area and the edge of the base.

In an example embodiment, a flexibility of the connecting area may be greater than a flexibility of the guide area.

In an example embodiment, the guide area may include a contact area in contact with the flexible area and a non-contact area not substantially in contact with the flexible area, and a surface roughness of the contact area may be substantially equal to or less than the surface roughness of the non-contact area.

In an example embodiment, the guide may include an edge that forms the guide area and the connecting area, does not face the flexible area, and more flexible than the guide area and the connecting area.

In an example embodiment, the guide may include a guide area configured to guide the flexible area and a connecting area configured to connect the guide area in an edge of the base.

In an example embodiment, the FPCB may include a plurality of stacked metal layers, and at least one dielectric layer located on at least one surface of each metal layer of the metal layers.

In an example embodiment, the guide is configured to guide the flexible area toward the guide based on the FPCB being in the folded form.

According to an example embodiment, a connecting assembly comprises: a flexible printed circuit board (FPCB) comprising: a first part, a second part, and a third part between the first part and the second part, wherein the third part comprises a rigid area and a flexible area, and a guide at least partially coupled to the rigid area, and located inside the FPCB, wherein the FPCB is configured to change shape between a folded form in which the FPCB is folded inward and an unfolded form in which the FPCB is unfolded outward.

In an example embodiment, the guide may be connected to the rigid area so as not to be fixed to the flexible area.

In an example embodiment, the guide may further include a base located in the rigid area and connecting the rigid area and the guide.

In an example embodiment, the guide may include a guide area having a substantially curved surface.

In an example embodiment, the guide area may include one of a closed curved surface, an open curved surface, and a substantially U-shaped curved surface.

In an example embodiment, the curved surface may have a substantially constant curvature along the curved surface.

In an example embodiment, the guide may include a guide area configured to guide the flexible area and a connecting area configured to connect the guide area and an edge of the base.

In an example embodiment, in an electronic device comprising a first housing a first printed circuit board (PCB), a second housing a second printed circuit board (PCB) and configured to move in a first direction and a second direction opposite to the first direction with respect to the first housing, the first part provides a connection with the first PCB and the second part provides a connection with the second PCB.

According to an example embodiment, a change in a shape of the connecting assembly may be constantly maintained. According to an example embodiment, a wrinkle start location of a wrinkling layer(s) among a plurality of layers of the connecting assembly may be constantly maintained. According to an example embodiment, the change in the shape of the connecting assembly may be maintained with a simple structure. According to an example embodiment, while the connecting assembly repeatedly changes shape, a radius of curvature of a curved surface formed by the connecting assembly may be constantly maintained substantially and a life of the connecting assembly may be improved. According to an example embodiment, the connecting assembly and an effect of the electronic device including the same may not be limited to the aforementioned ones, and other effects not mentioned may be clearly understood by a person skilled in the art from the following description.

Features of the above described embodiments and aspects can be combined unless their combining results in evident technical conflicts.

While the disclosure has been illustrated and described with reference to example embodiments, it will be understood that the example embodiments are intended to be illustrative, not limiting. It will be further understood by those skilled in the art that various changes in form and detail may be made without departing from the full scope of the disclosure, including the appended claims and their equivalents. It will also be understood that any of the embodiment(s) described herein may be used in conjunction with any other embodiment(s) described herein.

What is claimed is:

1. An electronic device comprising:
    a first housing comprising a first printed circuit board (PCB);
    a second housing comprising a second PCB and configured to move in a first linear direction and a second linear direction opposite to the first linear direction with respect to the first housing;
    a flexible display supported by at least one of the first housing and the second housing, wherein an area of a display screen of the flexible display is configured to be expanded or reduced by a linear movement of the second housing with respect to the first housing;
    a flexible printed circuit board (FPCB) comprising:
        a first part connected to the first PCB;
        a second part connected to the second PCB; and
        a third part between at least the first part and the second part, and
        wherein the third part comprises a rigid area and a flexible area; and
        a guide at least partially coupled to the rigid area,
    wherein the FPCB is configured to change shape between a folded form in which the FPCB is folded inward and an unfolded form in which the FPCB is unfolded outward based on a linear position of the first housing relative to the second housing.

2. The electronic device of claim 1, wherein the guide is connected to the rigid area so as not to be fixed to the flexible area.

3. The electronic device of claim 2, wherein the guide comprises a base located in the rigid area and configured to connect the rigid area and the guide.

4. The electronic device of claim 2, wherein the guide comprises a guide area having a substantially curved surface.

5. The electronic device of claim 4, wherein the guide area includes one of a closed curved surface, an open curved surface, or a substantially U-shaped curved surface.

6. The electronic device of claim 4, wherein the curved surface has a substantially constant curvature along the curved surface.

7. The electronic device of claim 3, wherein the guide comprises:
    a guide area configured to guide the flexible area; and
    a connecting area configured to connect the guide area and an edge of the base.

8. The electronic device of claim 7, wherein the guide area comprises:
    a contact area in contact with the flexible area; and
    a non-contact area not substantially in contact with the flexible area,
    wherein a surface roughness of the contact area is substantially equal to or less than a surface roughness of the non-contact area.

9. The electronic device of claim 7, wherein the guide comprises an edge that forms the guide area and the connecting area, does not face the flexible area, and more flexible than the guide area and the connecting area.

10. The electronic device of claim 3, wherein the guide comprises:
    a guide area configured to guide the flexible area; and
    a connecting area configured to connect the guide area and an area in an edge of the base.

11. The electronic device of claim 1, wherein the FPCB comprises:
    a plurality of stacked metal layers; and
    at least one dielectric layer located on at least one surface of each metal layer of the metal layers.

12. The electronic device of claim 1, wherein the guide is configured to guide the flexible area toward the guide based on the FPCB being in the folded form.

13. An electronic device comprising:
    a first housing comprising a first printed circuit board (PCB);
    a second housing comprising a second PCB and configured to move in a first linear direction and a second linear direction opposite to the first linear direction with respect to the first housing;
    a flexible display supported by the first housing and the second housing, wherein an area of a display screen of the flexible display is configured to be expanded or reduced by a linear movement of the second housing with respect to the first housing;
    a flexible printed circuit board (FPCB) comprising:
        a first part connected to the first PCB;
        a second part connected to the second PCB; and
        a third part between the first part and the second part, and
        wherein the third part comprises a rigid area and a flexible area; and
        a guide at least partially coupled to the rigid area, wherein the FPCB is configured to change shape between a folded form in which the FPCB is folded inward and an unfolded form in which the FPCB is unfolded outward, wherein the guide comprises a guide area configured to guide the flexible area and a connecting area configured to connect the guide area and an edge of the base, and wherein a flexibility of the connecting area is greater than a flexibility of the guide area.

* * * * *